(12) United States Patent
Hsieh et al.

(10) Patent No.: US 7,576,993 B2
(45) Date of Patent: Aug. 18, 2009

(54) ELECTRONIC DEVICE HAVING ELASTIC GROUNDING CLIP

(75) Inventors: Ming-Chih Hsieh, Taipei Hsien (TW); Tsung-Hsi Li, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/038,801

(22) Filed: Feb. 27, 2008

(65) Prior Publication Data

US 2009/0154117 A1 Jun. 18, 2009

(30) Foreign Application Priority Data

Dec. 12, 2007 (CN) .................... 2007 1 0203008

(51) Int. Cl.
*H05K 5/00* (2006.01)
(52) U.S. Cl. .................. 361/753; 361/799; 361/728
(58) Field of Classification Search ......... 361/752–753, 361/600, 679.01, 748, 790, 797, 799, 800, 361/756, 727, 736–737; 439/55, 76.1, 78–79, 439/92
See application file for complete search history.

(56) References Cited

U.S. PATENT DOCUMENTS

| | | | | |
|---|---|---|---|---|
| 5,513,996 A * | 5/1996 | Annerino et al. | ............. | 439/95 |
| 5,563,450 A * | 10/1996 | Bader et al. | ................. | 257/785 |
| 5,599,080 A * | 2/1997 | Ho | .......................... | 312/334.7 |
| 5,777,856 A * | 7/1998 | Phillips et al. | ............. | 361/816 |
| 6,735,093 B2 * | 5/2004 | Mu-Tsai | ..................... | 361/818 |
| 6,780,030 B2 * | 8/2004 | Yoshinaga et al. | ........... | 439/92 |
| 7,154,371 B1 * | 12/2006 | Balzano | .................. | 338/22 SD |

* cited by examiner

*Primary Examiner*—Hung S Bui
(74) *Attorney, Agent, or Firm*—Frank R. Niranjan

(57) ABSTRACT

An elastic grounding clip, set between a PCB and a housing of an electronic device, includes two first main pieces, a first connection piece connected between the two first main pieces, a second main piece adjacent one of the first main pieces, and a second connection piece connected between the one of the first main pieces and the second main piece. The two first main pieces and the first connection piece bound a first clamping part configured for clamping the PCB, and the corresponding first main piece, the second connection piece, and the second main piece bound a second clamping part configured for clamping a protruding portion of the housing of the electronic device.

15 Claims, 11 Drawing Sheets

ELECTRONIC DEVICE HAVING ELASTIC GROUNDING CLIP

BACKGROUND

1. Field of the Invention

The present invention relates to an electronic device having an elastic grounding clip.

2. Description of Related Art

Grounding is crucial in electronic devices for reducing electro magnetic interference (EMI), so as to achieve desired functions for the electronic devices.

Referring to FIG. 11, opposite edges of a common printed circuit board (PCB) 1 are respectively slidably received in two channels 3 of, and electrically connected to ground through opposite sidewalls of a housing 2 of an electronic device. However, if a size of the channel 3 is even a little greater than a thickness of the PCB 1, the corresponding edge of the PCB 1 may easily move in the channel 3, which may lead to a bad electrical connection between the PCB 1 and the housing 2. If the size of the channel 3 is even a little smaller than the thickness of the PCB 1, the corresponding edge of the PCB 1 may be damaged when slid into the channel 3.

What is desired, therefore, is an electronic device having an elastic grounding clip that helps to prevent edges of a PCB of the electronic device from being damaged by a housing of the electronic device, and to insure an electrical connection between the PCB and the housing.

SUMMARY

An exemplary elastic grounding clip, set between a PCB and a housing of an electronic device, includes two first main pieces, a first connection piece connected between the two first main pieces, a second main piece adjacent one of the first main pieces, and a second connection piece connected between the one of the first main pieces and the second main piece. The two first main pieces and the first connection piece bound a first clamping part configured for clamping the PCB, and the one of the first main piece, the second connection piece, and the second main piece bound a second clamping part configured for clamping a protruding portion of the housing of the electronic device.

Other advantages and novel features will become more apparent from the following detailed description of embodiment when taken in conjunction with the accompanying drawings, in which:

DETAILED DESCRIPTION

Figure 1:
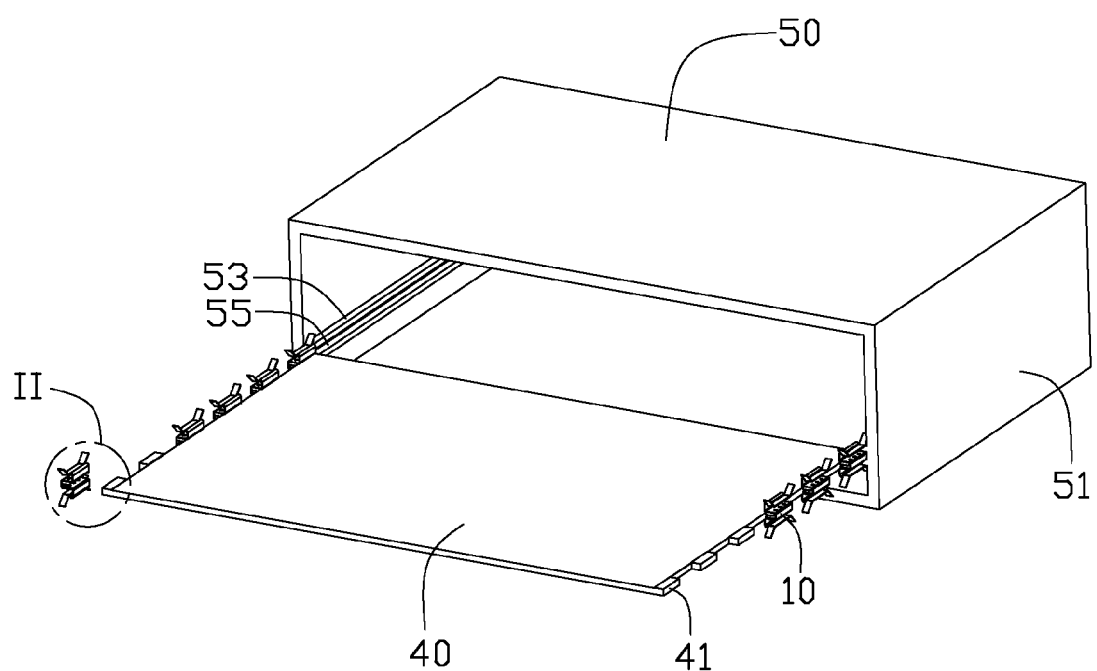
FIG. 1 is an exploded, isometric view of an electronic device in accordance with an embodiment of the present invention, the electronic device including a housing, a PCB, and a plurality of elastic grounding clips.

Referring to FIG. 1, an electronic device in accordance with an embodiment of the present invention includes a housing 50, a PCB 40, and a plurality of elastic grounding clips 10.

The housing 50 includes two opposite sidewalls 51. Each sidewall 51 includes two elongate bars 53 extending in from an inner surface thereof, between which a channel 55 is defined. The channels 55 of the sidewalls 51 are opposite to each other.

A plurality of protrusions 41 extends from opposite edges of the PCB 40. At least one protrusion 41 of the PCB 40 is coated with conductive material to be electrically connected to a ground layer of the PCB 40. In the present embodiment, each protrusion 41 is coated with conductive material.

Referring to FIGS. 2 to 5, the elastic grounding clips 10 are made of or coated with conductive material. Each elastic grounding clip 10 is generally W-shaped. The elastic grounding clip 10 includes two parallel first main pieces 25, a first connection piece 27 connected between corresponding sides of the first main pieces 25, two second main pieces 35 respectively located above and below the first main pieces 25, and two second connection pieces 37 respectively connected between the first main pieces 25 and the corresponding second main pieces 35. A plurality of jointing holes 21 is defined in each first main piece 25 for optionally allowing access for welding the first main pieces 25 to corresponding surfaces of the protrusions 41 respectively. Each first main piece 25 includes two blocking tabs 23 respectively slantedly extending from opposite ends thereof toward the other first main piece 25. If the welding option is chosen the blocking tabs 23 may be omitted. An arc-shaped connection portion 31 whose opening faces to the first main pieces 25 is formed at a junction of each second main piece 35 and its corresponding second connection piece 37. Each second main piece 35 includes two guiding tabs 33 respectively slantedly extending from opposite ends thereof away from the corresponding first main piece 25. Thus, an n-shaped first clamping part 20 located in a middle portion of the elastic grounding clip 10 is bounded by the first main pieces 25 and the first connection piece 27, and two n-shaped second clamping parts 30 respectively located in an upper portion and a lower portion of the elastic grounding clip 10 are each bounded by a corresponding one of the first main pieces 25, a corresponding one of the second connection pieces 37, and a corresponding one of the second main pieces 35. A direction of the opening of the first clamping part 20 is opposite to the openings of the second clamping parts 30.

Figure 2:
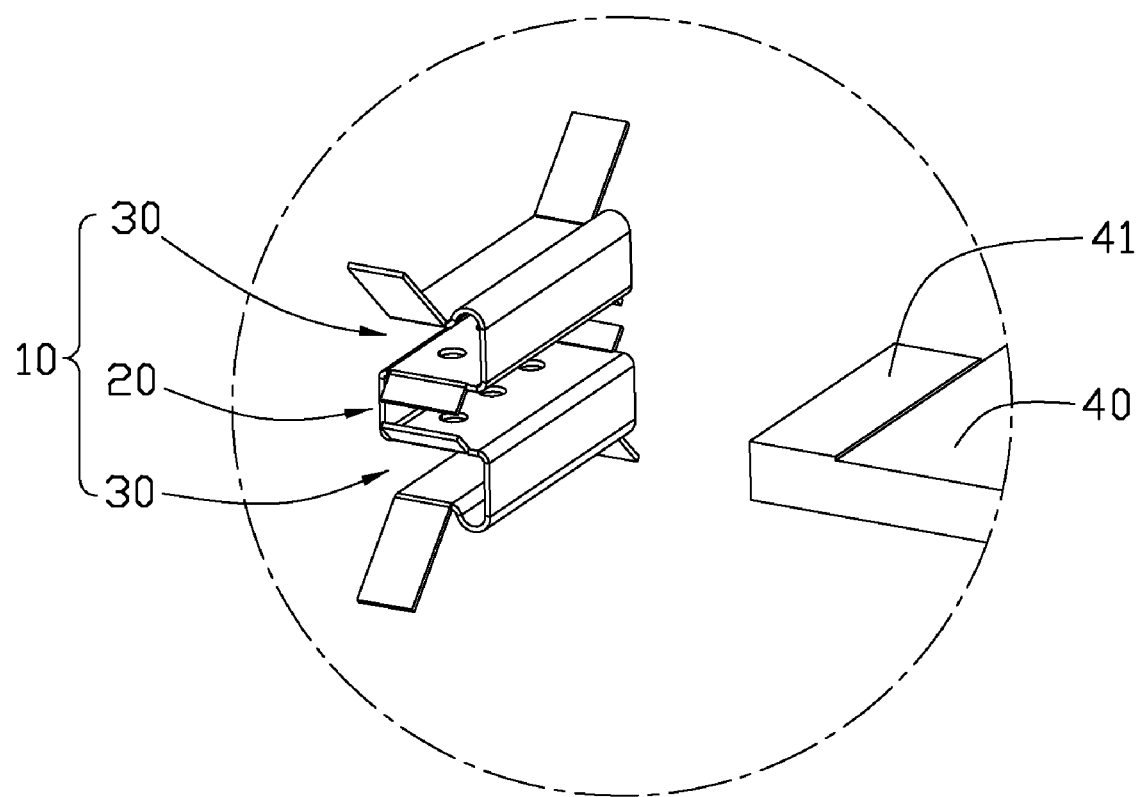
FIG. 2 is an enlarged view of a circled portion 11 of FIG. 1.
Figure 3:
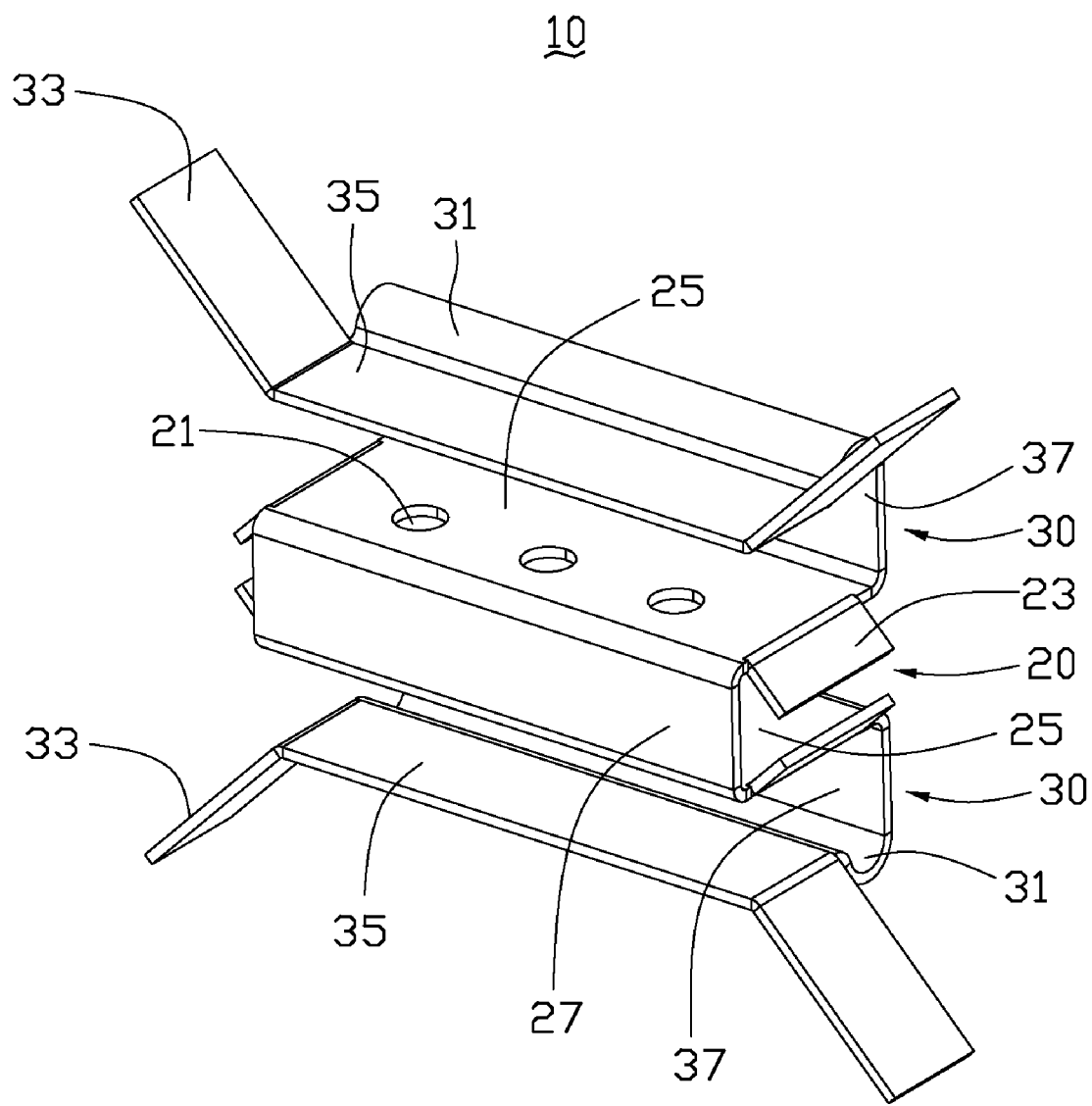
FIG. 3 is an enlarged view of one of the elastic grounding clips of FIG. 1, but viewed from another aspect.
Figure 4:
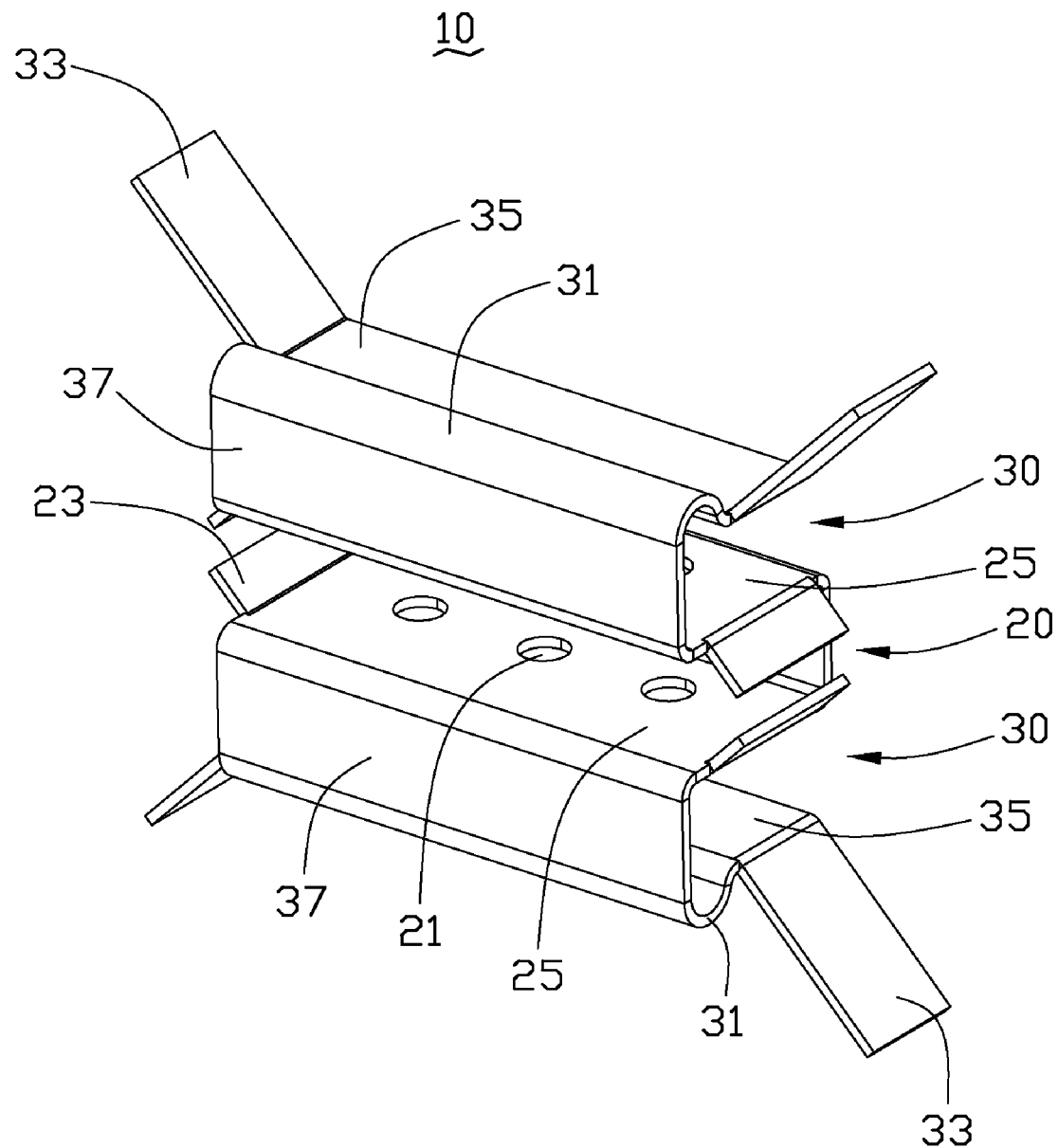
FIG. 4 is similar to FIG. 3, but viewed from another aspect.
Figure 5:
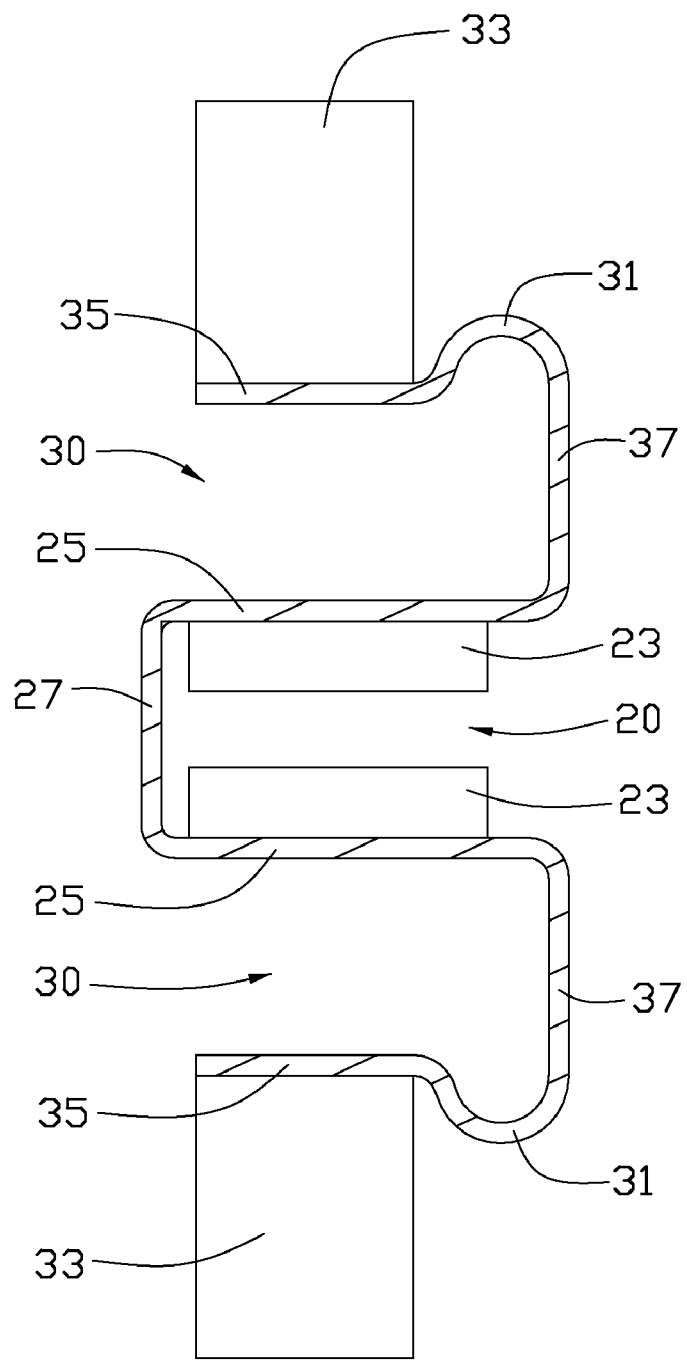
FIG. 5 is a longitudinal cut-away view of FIG. 3.
Figure 6:
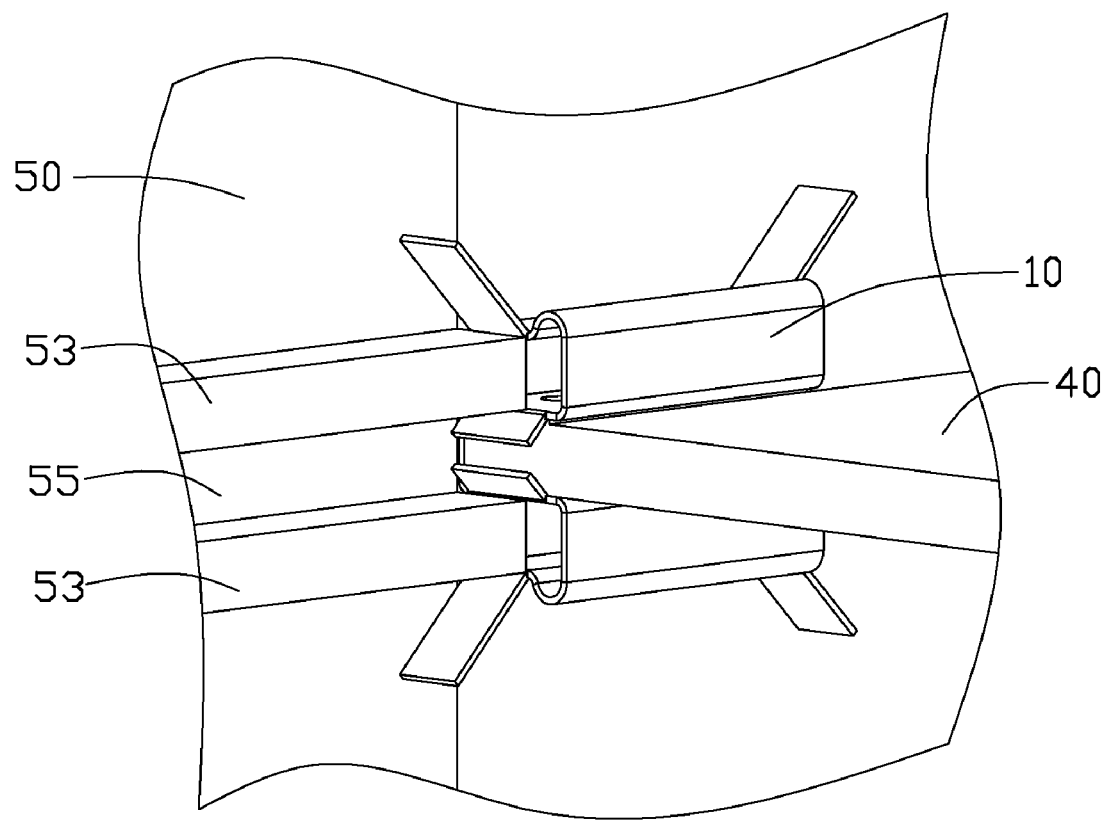
FIG. 6 is a partial view of FIG. 1, but viewed from another aspect.
Figure 7:
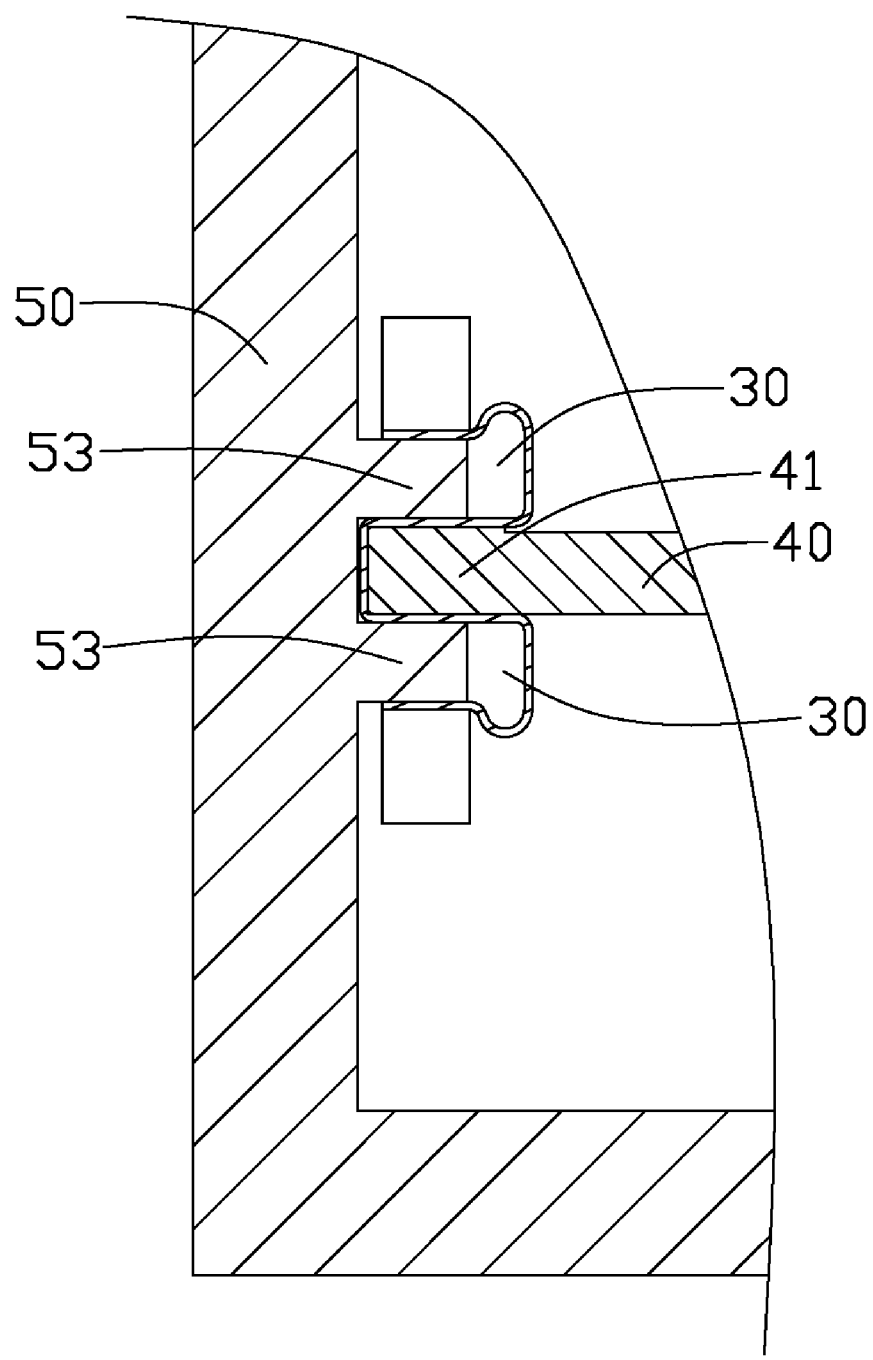
FIG. 7 is an assembled, cut-away view of FIG. 6.

Referring to FIGS. 2, 6, and 7, in assembly, each protrusion 41 of the PCB 40 is received in and clamped by the first clamping part 20 of a corresponding elastic grounding clip 10. The combined assembly of the PCB 40 and the elastic grounding clips 10 are slid into the housing 50. The first clamping part 20 of each elastic grounding clip 10 is slidably received in a corresponding channel 55 of the housing 50, while the bars 53 of the housing 50 are slidably received in the corresponding second clamping parts 20 of each elastic grounding clip 10. In actual use, not all of the protrusions 41 of the PCB 40 need be clamped by the elastic grounding clips 10. The blocking tabs 23 and the guiding tabs 33 of the elastic grounding clips 10 are used to guide the bars 53 of the housing 50 to easily slide along the corresponding second clamping parts 30, and the blocking tabs 23 are also used to prevent unwanted disengagement of the elastic grounding clips 10 from the corresponding protrusions 41 of the PCB 40.

In other embodiments, if the PCB 40 need only be installable from one end of the channels 55, then the guiding tabs 33 extending away from a moving direction of each elastic grounding clip 10, may be omitted, thus saving material.

Furthermore, the elastic grounding clips 10 can be made of electrically conductive EMI-proof material, in order to reduce electro magnetic radiation from the electronic device.

Figure 8:
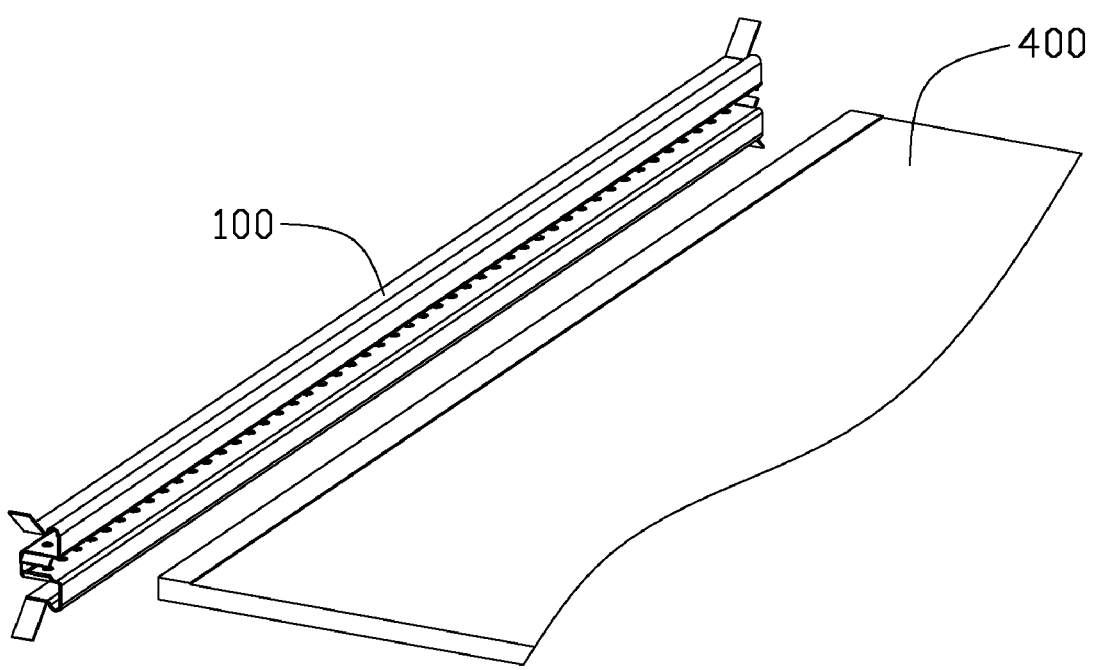
FIG. 8 is an exploded, isometric view of an electronic device in accordance with a second embodiment of the present invention, the electronic device including a PCB and an elastic grounding clip.

Referring to FIG. 8, an electronic device is provided in accordance with a second embodiment of the present invention. The electronic device includes a housing (not shown), a PCB 400, and two elastic grounding clips 100. A protrusion extends from each of two opposite edges of the PCB 400, having a length equal to that of the edge of the PCB. A size of each elastic grounding clip 100 is suited for the protrusion of the PCB 400.

Figure 9:
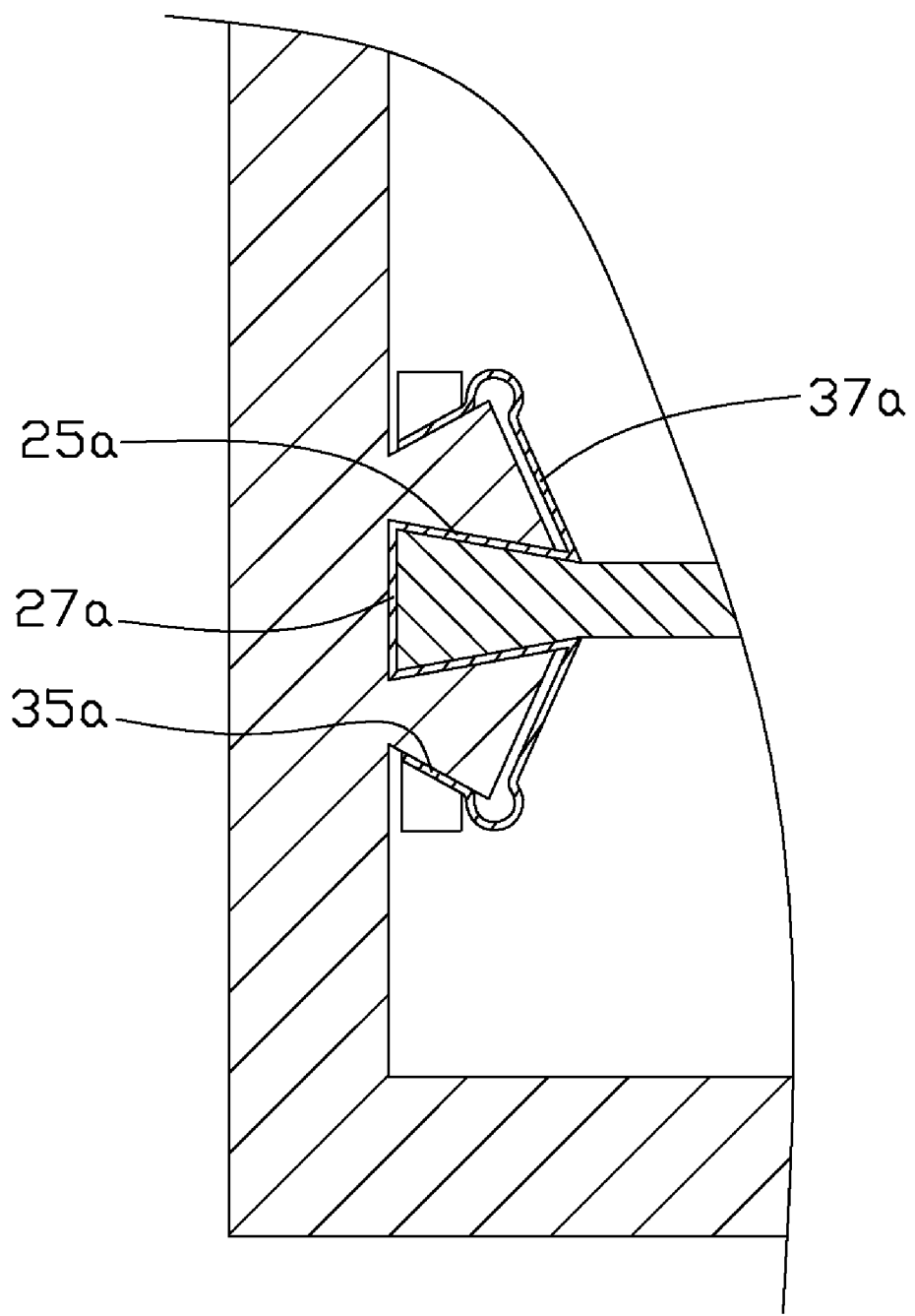
FIGS. 9 and 10 are similar to FIG. 7, but showing third and fourth embodiments respectively of the present invention.
Figure 10:
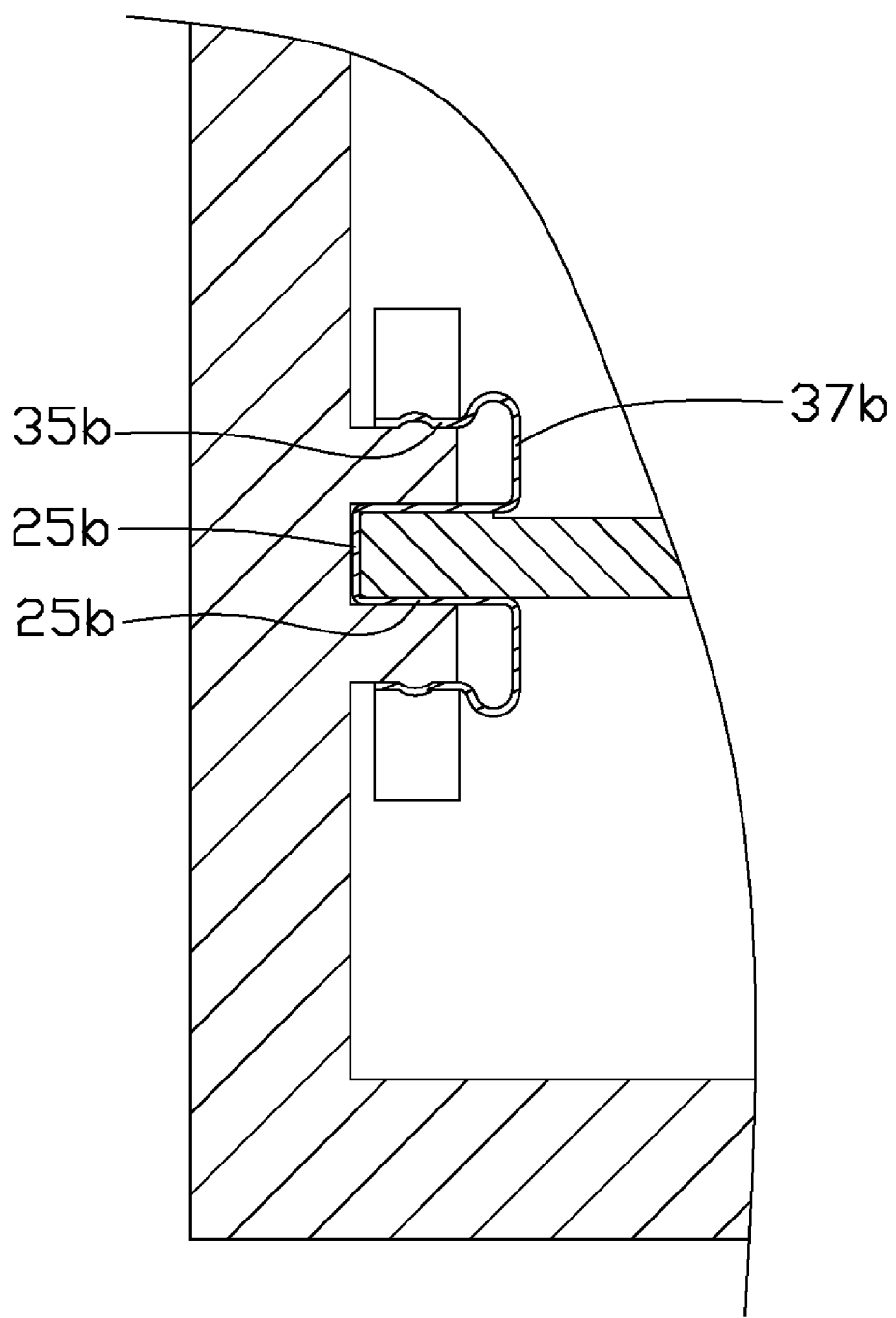
Figure 11:
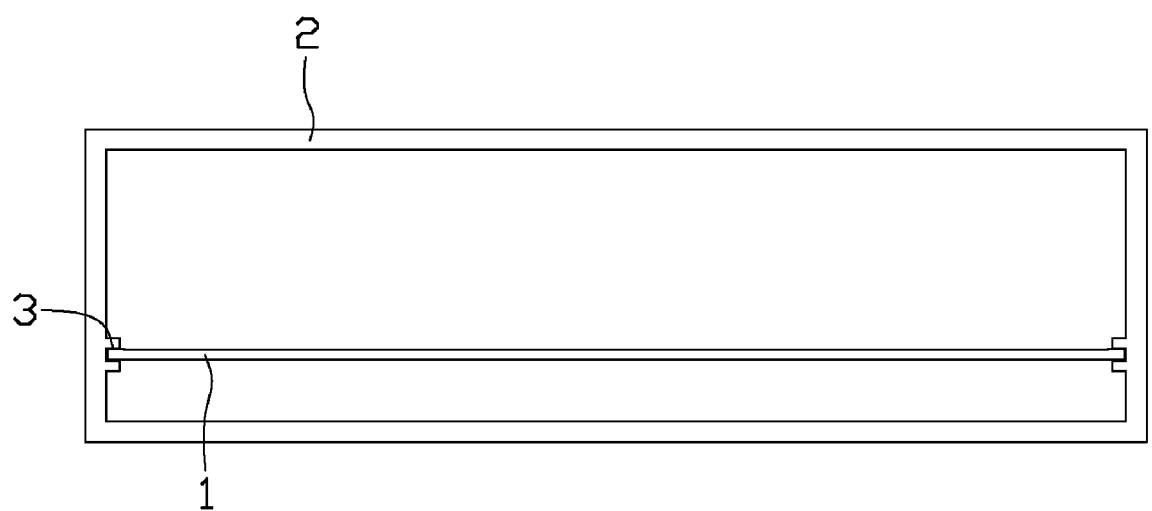
FIG. 11 is an assembled, plane view of a PCB and a housing of a common electronic device.

It is noted that the main pieces 25, 35 of the elastic grounding clips 10 should not be simply considered to be horizontal and smooth, and the connection pieces 27, 37 of the elastic grounding clips 10 should not be simply considered to be vertical and smooth. Because shapes of the main pieces 25, 35 and the connection pieces 27, 37 are designed to fit shapes of the bars 53 and the channels 55 of the housing 50. In other embodiments, according to different shapes of the bars 53 and the channels 55, the main pieces 25a, 35a may not be horizontal and the connection pieces 27a, 37a may not be vertical (see FIG. 9), and the main pieces 25b, 35b and the connection pieces 27b, 37b may not be smooth (see FIG. 10).

It is believed that the present embodiments and their advantages will be understood from the foregoing description, and they will be apparent that various changes may be made thereto without departing from the spirit and scope of the invention or sacrificing all of its material advantages, the examples hereinbefore described merely being preferred or exemplary embodiments of the invention.

What is claimed is:

1. An elastic grounding clip set between a printed circuit board (PCB) and a housing of an electronic device, comprising:
   two first main pieces;
   a first connection piece connected between the two first main pieces;
   a second main piece adjacent one of the first main pieces; and
   a second connection piece connected between said one of the first main pieces and the second main piece;
   wherein the two first main pieces and the first connection piece bound a first clamping part configured for clamping the PCB, the corresponding first main piece, the second connection piece, and the second main piece bound a second clamping part configured for clamping a protruding portion of the housing of the electronic device.

2. The elastic grounding clip as claimed in claim 1, wherein the first clamping part and the second clamping part are generally n-shaped, and a direction the opening of the first clamping part is opposite to the opening of the second clamping part.

3. The elastic grounding clip as claimed in claim 2, wherein an arc-shaped connection portion whose opening faces to the first main pieces is formed at a junction of the second main piece and the second connection piece.

4. The elastic grounding clip as claimed in claim 2, wherein each of the two first main pieces comprises two blocking tabs respectively slantedly extending from opposite ends thereof toward the other one of the first main pieces.

5. The elastic grounding clip as claimed in claim 4, wherein the second main piece comprises two guiding tabs respectively slantedly extending from opposite ends thereof away from the corresponding first main piece.

6. The elastic grounding clip as claimed as claimed in claim 2, wherein at least one of the first main pieces defines at least one jointing hole, configured for fixing said grounding clip to the housing of the electronic device.

7. The elastic grounding clip as claimed as claimed in claim 6, wherein each of the first main pieces comprises a blocking tab slantedly extending from an end thereof toward the other one of the first main pieces, the second main pieces comprises a guiding piece slantedly extending from an end thereof away from the corresponding first main piece, the blocking tabs and the guiding tabs are located at a same side of the elastic grounding clip.

8. An electronic device comprising:
   a housing comprising two opposite sidewalls, each of the sidewalls comprising two bars extending from an inner surface thereof, between which a channel being defined;
   a printed circuit board (PCB) comprising a ground layer and two opposite edges, at least one protrusion electrically connected to the ground layer extending from each of the edges of the PCB; and
   at least two elastic grounding clips respectively engaging with said at least one protrusion of each of the edges of the PCB, each of the elastic grounding clips comprising:
      two first main pieces located in a middle portion thereof;
      a first connection piece connected between the two first main pieces;
      two second main pieces respectively located at an upper portion and a lower portion thereof; and
      two second connection piece respectively connected between each of the first main pieces and a corresponding second main piece;
      wherein the first main pieces and the first connection piece bound a first clamping part configured for clamping the corresponding protrusion of the edges of the PCB, and each of the first main piece, a corresponding second connection piece, and a corresponding second main piece bound a second clamping part configured for clamping a corresponding bar of the housing.

9. The electronic device as claimed in claim 8, wherein the first clamping part and the second clamping parts of each of said at least two elastic grounding clips are generally n-shaped, and a direction the opening of the first clamping part is opposite to the openings of the second clamping parts.

10. The electronic device as claimed in claim 9, wherein an arc-shaped connection portion whose opening faces to the first main pieces is formed at a junction of each of the second main pieces and a corresponding second connection piece of each of said at least two elastic grounding clips.

11. The electronic device as claimed in claim 9, wherein each of the first main pieces of each of said at least two elastic grounding clips comprises two blocking tabs respectively slantedly extending from opposite ends thereof toward the other one of the first main pieces.

12. The electronic device as claimed in claim 1, wherein each of the second main pieces of each of said at least two elastic grounding clips comprises two guiding tabs respectively slantedly extending from opposite ends thereof away from the corresponding first main piece.

13. The electronic device as claimed in claim 9, wherein at least one of the first main pieces of each of said at least two elastic grounding clips defines at least one jointing hole, configured for fixing said at least two grounding clip to the corresponding bars of the housing.

14. The electronic device as claimed as claimed in claim 13, wherein each of the first main pieces of each of said at least two elastic grounding clips comprises a blocking tab slantedly extending from an end thereof toward the other one of the first main pieces, each of the second main pieces of each of said at least two elastic grounding clips comprises a guiding tab slantedly extending from an end thereof away from the corresponding first main piece the blocking tabs and the guiding tabs are located at a same side of the elastic grounding clip.

15. The electronic device as claimed in claim 8, wherein a plurality of protrusions extends from opposite edges of the PCB, each of the protrusions is coated with conductive material for electrically connected to the ground layer of the PCB, a plurality of elastic grounding clips is supplied corresponding to the protrusions.

* * * * *